(12) United States Patent
Wang et al.

(10) Patent No.: US 7,620,860 B2
(45) Date of Patent: Nov. 17, 2009

(54) SYSTEM AND METHOD OF DYNAMICALLY MAPPING OUT FAULTY MEMORY AREAS

(75) Inventors: Bi-Chong Wang, Austin, TX (US); Vijay Nijhawan, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 243 days.

(21) Appl. No.: 11/851,683

(22) Filed: Sep. 7, 2007

(65) Prior Publication Data
US 2009/0070642 A1 Mar. 12, 2009

(51) Int. Cl.
*G11C 29/00* (2006.01)
(52) U.S. Cl. ...................... 714/723; 714/704
(58) Field of Classification Search ................ 455/423; 370/244; 365/200; 711/156; 701/33; 714/723, 714/704
See application file for complete search history.

(56) References Cited

U.S. PATENT DOCUMENTS

| | | | |
|---|---|---|---|
| 6,215,997 B1 * | 4/2001 | Han | 455/423 |
| 7,043,666 B2 | 5/2006 | Wynn et al. | |
| 7,359,330 B2 * | 4/2008 | Lunt et al. | 370/244 |
| 7,483,319 B2 * | 1/2009 | Brown | 365/200 |
| 2008/0005504 A1 * | 1/2008 | Barnes et al. | 711/156 |
| 2008/0161993 A1 * | 7/2008 | Groer et al. | 701/33 |

OTHER PUBLICATIONS

U.S. Appl. No. 11/300,820, filed Dec. 15, 2005.
U.S. Appl. No. 11/344,647, filed Feb. 1, 2006.
U.S. Appl. No. 11/372,569, filed Mar. 10, 2006.
U.S. Appl. No. 11/467,600, filed Aug. 28, 2006.
U.S. Appl. No. 11/759,088, filed Jun. 6, 2007.
U.S. Appl. No. 11/854,034, filed Sep. 12, 2007.

* cited by examiner

*Primary Examiner*—David Ton
(74) *Attorney, Agent, or Firm*—Larson Newman & Abel, LLP

(57) ABSTRACT

An information handling system is disclosed and can include a processor and a memory coupled to the processor. Further, the system can include a system reserved area that is accessible to the processor. The system reserved area can include a physical memory fault table having a plurality of bits and each bit in the physical memory fault table can represent an equal block of the memory.

20 Claims, 3 Drawing Sheets

SYSTEM AND METHOD OF DYNAMICALLY MAPPING OUT FAULTY MEMORY AREAS

FIELD OF THE DISCLOSURE

The present disclosure relates generally to information handling systems. More specifically, the present disclosure relates to preventing bad memory access in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

An information handling system is disclosed and can include a processor and a memory coupled to the processor. Further, the system can include a system reserved area that is accessible to the processor. The system reserved area can include a physical memory fault table having a plurality of bits and each bit in the physical memory fault table can represent an equal block of the memory.

In another embodiment, a method of preventing access to bad memory areas in an information handling system is disclosed and can include allocating a physical memory fault table. The physical memory fault table can include a plurality of bits and each bit in the physical memory fault table can represent an equal block of the memory. The method can further include monitoring memory errors in a memory and selectively changing a value of one or more bits in the physical memory fault table based on a number of errors in the memory.

In yet another embodiment, a method of monitoring memory errors in an information handling system is disclosed and can include detecting a single-bit memory error, locating a source of the error within a memory, and translating the source of the error to a physical address within a physical memory fault table.

As indicated above, the following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. For example, much of the following focuses on dynamically changing file types within a distributed file systems. While the teachings may certainly be utilized in this application, the teachings may also be utilized in other applications and with several different types of architectures such as distributed computing architectures, client/server architectures, or middleware server architectures.

Figure 1:
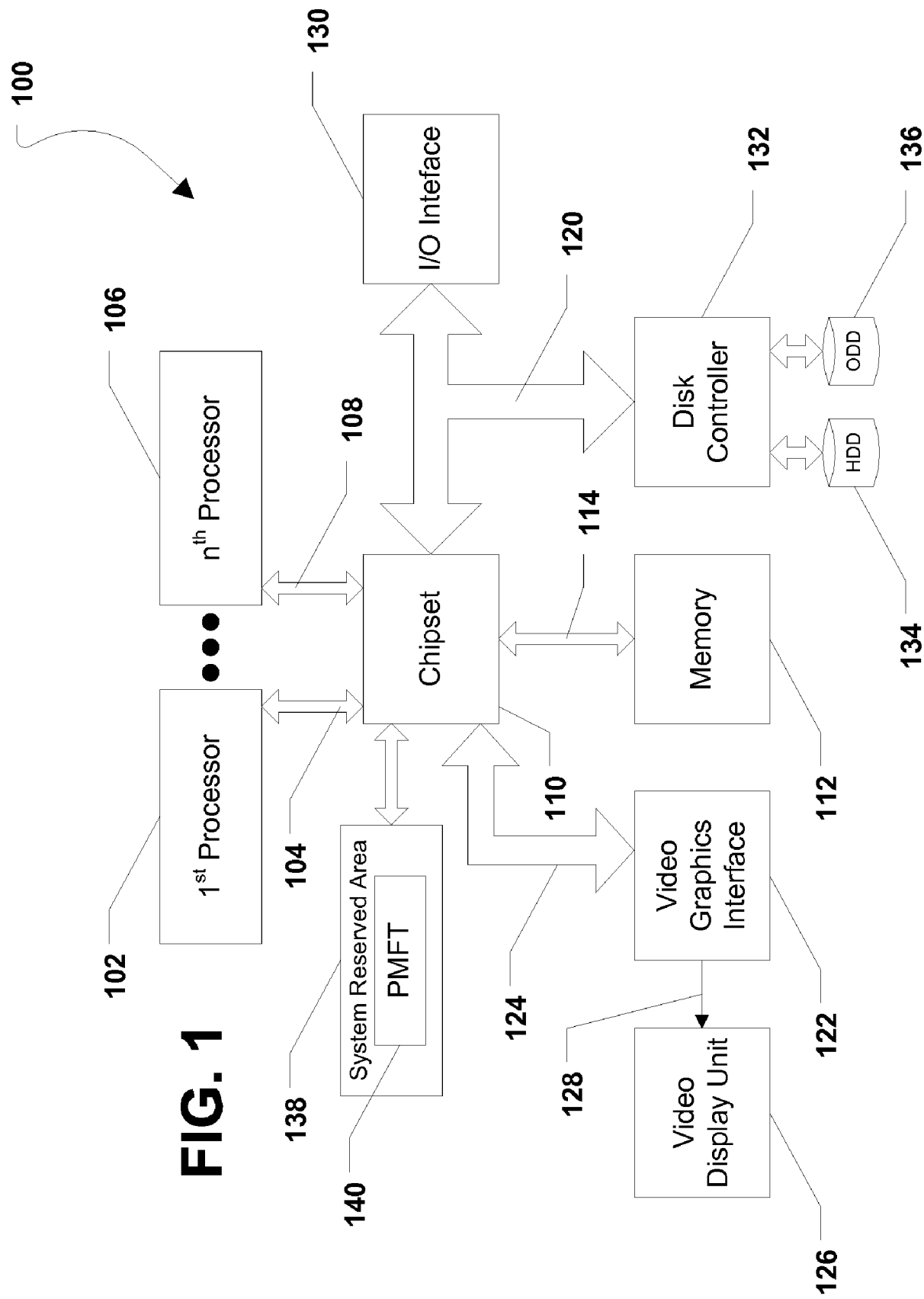
FIG. 1 is a block diagram of an information handling system.

FIG. 1 illustrates a block diagram of an exemplary embodiment of an information handling system, generally designated at 100. In one form, the information handling system 100 can be a computer system such as a server. As shown in FIG. 1, the information handling system 100 can include a first physical processor 102 coupled to a first host bus 104 and can further include additional processors generally designated as $n^{th}$ physical processor 106 coupled to a second host bus 108. The first physical processor 102 can be coupled to a chipset 110 via the first host bus 104. Further, the $n^{th}$ physical processor 106 can be coupled to the chipset 110 via the second host bus 108. The chipset 110 can support multiple processors and can allow for simultaneous processing of multiple processors and support the exchange of information within information handling system 100 during multiple processing operations.

According to one aspect, the chipset 110 can be referred to as a memory hub or a memory controller. For example, the chipset 110 can include a dedicated bus to transfer data between first physical processor 102 and the $n^{th}$ physical processor 106. For example, the chipset 110 including a chipset that can include a memory controller hub and an input/output (I/O) controller hub. As a memory controller hub, the chipset 110 can function to access the first physical processor 102 using first bus 104 and the $n^{th}$ physical processor 106 using the second host bus 108. The chipset 110 can also provide a memory interface for accessing memory 112 using a memory bus 114. In a particular embodiment, the buses 104, 108, and 114 can be individual buses or part of the same bus. The chipset 110 can also provide bus control and can handle transfers between the buses 104, 108, and 114.

According to another aspect, the chipset 110 can include an application specific chipset that provides connectivity to various buses, and integrates other system functions. For example, the chipset 110 can be provided using an Intel® Hub Architecture (IHA) chipset that can also include two parts, a Graphics and AGP Memory Controller Hub (GMCH) and an I/O Controller Hub (ICH). For example, an Intel 820E, an 815E chipset, an Intel 975X chipset, an Intel G965 chipset, available from the Intel Corporation of Santa Clara, Calif., or any combination thereof, can provide at least a portion of the chipset 110. The chipset 110 can also be packaged as an application specific integrated circuit (ASIC).

In one form, the chipset 110 can be coupled to a video graphics interface 122 using a third bus 124. In one form, the video graphics interface 122 can be a Peripheral Component Interconnect (PCI) Express interface operable to provide content to display within a video display unit 126. Other graphics interfaces may also be used. The video graphics interface 122 can provide a video display output 128 to the video display unit 126. The video display unit 126 can include one or more types of video displays such as a flat panel display (FPD), cathode ray tube display (CRT) or other type of display device.

The information handling system 100 can also include an I/O interface 130 that can be connected via an I/O bus 120 to the chipset 110. The I/O interface 130 and I/O bus 120 can include industry standard buses or proprietary buses and respective interfaces or controllers. For example, the I/O bus 120 can also include a PCI bus or a high speed PCI-Express bus. In one embodiment, a PCI bus can be operated at approximately 66 MHz and a PCI-Express bus can be operated at more than one (1) speed (e.g. 2.5 GHz and 5 GHz). PCI buses and PCI-Express buses can be provided to comply with industry standards for connecting and communicating between various PCI-enabled hardware devices. Other buses can also be provided in association with, or independent of, the I/O bus 120 including, but not limited to, industry standard buses or proprietary buses, such as Industry Standard Architecture (ISA), Small Computer Serial Interface (SCSI), Inter-Integrated Circuit (I²C), System Packet Interface (SPI), or Universal Serial buses (USBs).

In an alternate embodiment, the chipset 110 can be a chipset employing a Northbridge/Southbridge chipset configuration (not illustrated). For example, a Northbridge portion of the chipset 110 can communicate with the first physical processor 102 and can control interaction with the memory 112, the I/O bus 120 that can be operable as a PCI bus, and activities for the video graphics interface 122. The Northbridge portion can also communicate with the first physical processor 102 using first bus 104 and the second bus 108 coupled to the n$^{th}$ physical processor 106. The chipset 110 can also include a Southbridge portion (not illustrated) of the chipset 110 and can handle I/O functions of the chipset 110. The Southbridge portion can manage the basic forms of I/O such as Universal Serial Bus (USB), serial I/O, audio outputs, Integrated Drive Electronics (IDE), and ISA I/O for the information handling system 100.

The information handling system 100 can further include a disk controller 132 coupled to the I/O bus 120, and connected to an I/O interface 130 and one or more internal disk drives such as a hard disk drive (HDD) 134 and an optical disk drive (ODD) 136 such as a Read/Write Compact Disk (R/W CD), a Read/Write Digital Video Disk (R/W DVD), a Read/Write mini-Digital Video Disk (R/W mini-DVD), or other type of optical disk drive.

FIG. 1 further illustrates that the information handling system 100 can include a system reserved area 138 that is accessible to the processors 102, 106, e.g., via the chipset 110. In a particular embodiment, the system reserved area 138 can include a physical memory fault table (PMFT) 140. The PMFT 140 can be a simple bitmap. For example, if each bit represents a one megabit (1 MB) of physical memory range, then a sixty-four kilobit (64 Kb) PMFT can map a sixty-four gigabyte (64 GB) physical memory.

Each bit in the PMFT can have a value that is configured to be set to error free, warning, or critical. A value of error free indicates that there are not any errors in a corresponding block of memory. A value of warning indicates that a number of errors in a corresponding block of memory have breached a warning threshold. A value of critical indicates that a number of errors in a corresponding block of memory have breached a critical threshold.

Figure 2:
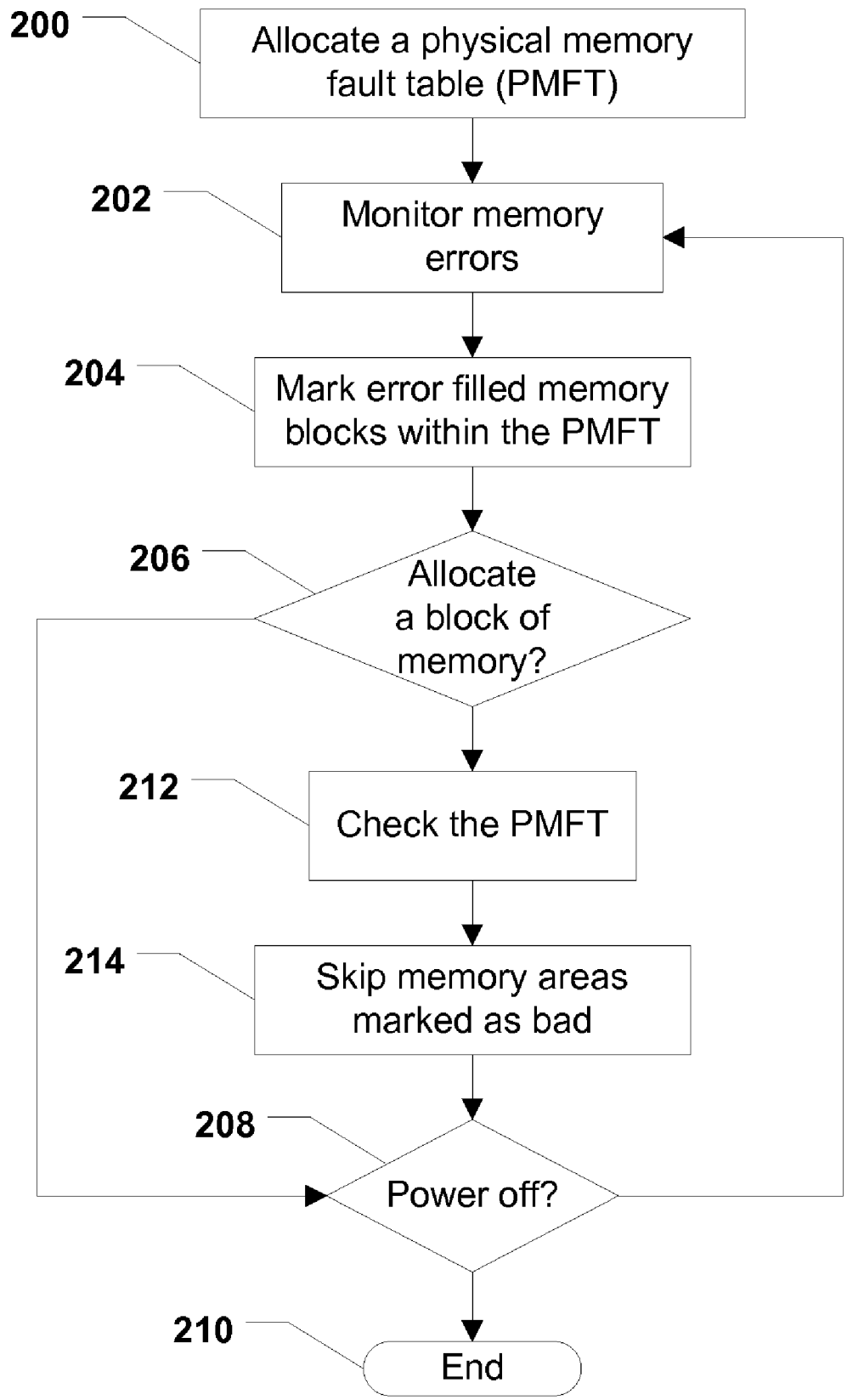
FIG. 2 is a flow chart illustrating a method of preventing access to bad memory areas in an information handling system.

Referring to FIG. 2, a method of preventing access to bad memory areas is shown and commences at block 200. At block 200, a system BIOS can allocate a physical memory fault table (PMFT). As stated above, the PMFT can be created in the system reserved area.

Moving to block 202, the system BIOS can monitor memory errors. At block 204, the system BIOS can mark error filled memory blocks within the PMFT. Proceeding to block 206, it can be determined whether the operating system (OS) needs to allocate a block of memory. If the OS does not need to allocate a block of memory, the method can move to decision step 208. At decision step 208, it can be determined whether the power is turned off. If so, the method can end at state 210. Otherwise, if the power is not turned off, the method can return to block 202 and continue as described herein.

Returning to decision step 206, if the OS needs to allocate a block of memory, the method moves to block 212 and the OS can check the PMFT. At block 214, the OS can skip the memory areas that are marked as bad in the PMFT. Thereafter, the method can proceed to decision step 208 and continue as described herein.

In a particular embodiment, the interface between the system BIOS and the OS can be ACPI method based. Further, to improve reliability a duplicate PMFT can be maintained in memory by the BIOS or on disk by the OS. Each PMFT can have entries for a block of memory, e.g., one megabyte (1 MB).

An example entry is shown below:

```
typedef struct {
U64 BaseAddress_of_Memory;  //Base address of memory
U64 Length_of_Memory;        //Length of memory
MemStatus Memory_Status;     //Status of Memory
} PMFTMemStruct;
typedef struct {
   U32  NumberofSingleBits;  //Number of single bit errors.
   U32  ModeOfMemoryError;   //Type of Error
}MemStatus;
```

The ModeOfMemory variable can have the following values:
0 No errors in the memory
1 Memory error warning
2 Critical number of single-bit errors
The PMFT table can be formatted as shown below:

```
PMFT:
db "PMFT"              ;Signature
db PMFT_end - PMFT     ;Table Length
db 1                   ;The constant 1
db 0                   ;Checksum
PMFT_oem_table_id:
db OEM_ID              ;OEM ID
db OEM_TABLE_ID        ;OEM Table ID
db OEM_REV             ;OEM Revision
db CREATOR_ID          ;Creator ID
db CREATOR_REV         ;Creator Revision
db 1                   ;Table revision 1 for PMFT
db 8 DUP (0)           ;8 Bytes, Reserved
```

-continued

```
;
; Each entry is for 1MB of memory Entries for system memory
;
PMFTMemStruct  <0,x100000, 0>           // 0 to 1MB of memory
PMFTMemStruct  <0x100000,0x200000,0,>   //1MB to 2MB of memory
...........................................  //Rest entries
PMFT_end:
```

The system can be configured in such a way that when single-bit errors occur, the system can generate SCI. As a result, OS can call the _Lxx method or _Exx method. Either method can tell the OS to re-evaluate a REME method in the ASL code. The REME method can read a Memory Controller register and find out the physical memory that caused the error. Based on the physical memory address, the REME method can update the entries of the PMFTMemStruct. The REME method can be an ACPI method that is called when single-bit errors occur. The REME method can re-evaluate the memory where the single-bit errors occur and return the information to the OS. After modifying the correct memory range of the PMFTMemStruct, the REME method can report the memory status to the OS. A system implementer can decide when to report the memory condition as warning or critical, as described in detail below. For example, when the number of single-bit errors is less than 10, the memory can be set as warning. Further, when the number of single-bit errors is greater than 10, the memory can be set as critical. Based on the information provided by the PMFT table and the REME method, OS can dynamically reduce the load it is running on the memory with warning and critical levels.

Figure 3:
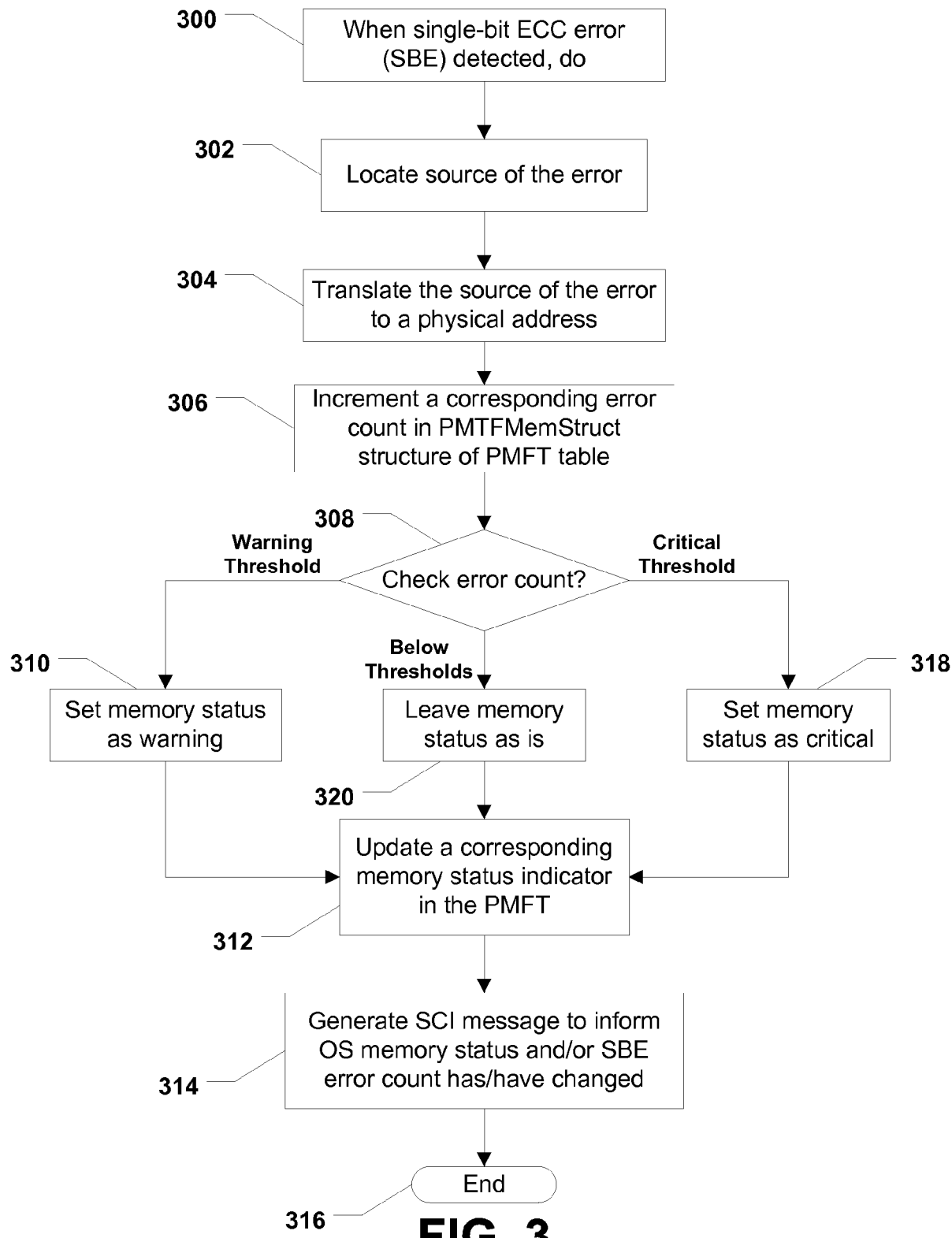
FIG. 3 is a flow chart illustrating a method of monitoring memory errors in an information handling system.

FIG. 3 illustrates a method of monitoring memory errors in an information handling system. Beginning at block 300, when a single-bit error correcting code (ECC) error (SBE) is detected, a do loop is entered and the following steps can be performed by the system BIOS. At block 302, the system BIOS can locate the source of the error. At block 304, the system BIOS can translate the source of the error to a physical address. Further, at block 306, the system BIOS can increment a corresponding error count in the PMTFMemStruct structure of the PMTF table.

Moving to decision step 308, the system BIOS can check the error count for a particular block of memory. If the error count is above a warning threshold, the method can move to block 310 and the system BIOS can set the memory status for that particular block of memory as warning. Thereafter, the method can move to block 312 and the system BIOS can update a corresponding memory status indicator in the PMFT. Proceeding to block 314, the system BIOS can generate a System Control Interrupt (SCI) message to inform the operating system of a potential change in memory status and/or a change in SBE error count. The method can then end at state 316.

Returning to decision step 308, when the error count is above a critical threshold, the method can continue to block 318 and the system BIOS can set the memory status for the particular block of memory as critical. Thereafter, the method can move to block 312 and continue as described herein. Also, at decision step 308, if the error count is below the warning threshold and the critical threshold, the method can proceed to block 320 and the system BIOS can leave the memory status as is. Then, the method can move to block 312 and continue as described herein.

With the configuration of structure described herein, the system and method described herein can be used to dynamically map out portions of memory that have multiple single-bit errors. As the number of single-bit errors increase in a portion of memory, the OS can be instructed to stop using the error prone portion of the memory.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
    a processor;
    a memory coupled to the processor; and
    a system reserved area accessible to the processor, wherein the system reserved area includes a physical memory fault table having a plurality of bits and wherein each bit in the physical memory fault table represents an equal block of the memory.

2. The information handling system of claim 1, wherein the physical memory fault table comprises a bitmap.

3. The information handling system of claim 2, wherein each bit in the physical memory fault table comprises a value that is configured to be set to error free, warning, or critical.

4. The information handling system of claim 3, wherein a bit having the value of error free indicates that there are not any errors in a corresponding block of memory.

5. The information handling system of claim 4, wherein a bit having the value of warning indicates that a number of errors in a corresponding block of memory have breached a warning threshold.

6. The information handling system of claim 4, wherein a bit having the value of critical indicates that a number of errors in a corresponding block of memory have breached a critical threshold.

7. The information handling system of claim 6, wherein an operating system can skip one or more blocks of memory with a corresponding bit having the value of critical.

8. A method of preventing access to bad memory areas in an information handling system, the method comprising:
    allocating a physical memory fault table, wherein the physical memory fault table includes a plurality of bits and wherein each bit in the physical memory fault table represents an equal block of the memory;
    monitoring memory errors in a memory; and
    selectively changing a value of one or more bits in the physical memory fault table based on a number of errors in the memory.

9. The method of claim 8, further comprising:
    determining whether to allocate a block of memory within the memory.

10. The method of claim 9, further comprising:
    checking the physical memory fault table before allocating the block of memory.

11. The method of claim 10, further comprising:
    skipping a block of memory having a corresponding bit in the physical memory fault table with a value of critical.

12. The method of claim 8, wherein the physical memory fault table comprises a bitmap.

13. The method of claim 12, wherein each bit in the physical memory fault table comprises a value that is configured to be set to error free, warning, or critical.

14. The method of claim 13, wherein the value of error free indicates that there are not any errors in a corresponding block of memory.

15. The method of claim 13, wherein the value of warning indicates that a number of errors in a corresponding block of memory are greater than a warning threshold.

16. The method of claim 13, wherein the value of critical indicates that a number of errors in a corresponding block of memory are greater than a critical threshold.

17. A method of monitoring memory errors in an information handling system, the method comprising:
- detecting a single-bit memory error;
- locating a source of the error within a memory; and
- translating the source of the error to a physical address within a physical memory fault table.

18. The method of claim 17, further comprising:
- incrementing a corresponding error count for a bit corresponding to the source of the error.

19. The method of claim 18, further comprising:
- determining whether the error count is greater than a warning threshold; and
- determining whether the error count is greater than a critical threshold.

20. The method of claim 19, further comprising:
- updating a memory status indicator based on the error count.

* * * * *